United States Patent [19]
Fukumoto

[11] Patent Number: 5,367,185
[45] Date of Patent: Nov. 22, 1994

[54] NON-VOLATILE SEMICONDUCTOR MEMORY WITH THIRD ELECTRODE COVERING CONTROL GATE

[75] Inventor: Takahiro Fukumoto, Nara, Japan

[73] Assignee: Sharp Kabushiki Kaisha, Osaka, Japan

[21] Appl. No.: 555

[22] Filed: Jan. 4, 1993

Related U.S. Application Data

[63] Continuation of Ser. No. 723,216, Jun. 28, 1991, abandoned.

[30] Foreign Application Priority Data

Jun. 29, 1990 [JP] Japan ............... 2-173801

[51] Int. Cl.$^5$ ........................... H01L 29/78
[52] U.S. Cl. ..................... 257/320; 257/326
[58] Field of Search .......... 357/23.5; 257/320, 322, 257/319, 326; 365/185

[56] References Cited

U.S. PATENT DOCUMENTS

| | | | |
|---|---|---|---|
| 4,361,847 | 11/1982 | Harari | 257/321 |
| 4,385,308 | 5/1983 | Uchida | 257/326 |
| 4,620,656 | 11/1986 | Kamiya et al. | 257/320 |
| 4,794,565 | 12/1988 | Wu et al. | 357/23.5 |
| 4,853,895 | 8/1989 | Mitchell et al. | 257/320 |
| 5,168,465 | 12/1992 | Harari | 257/320 |
| 5,262,987 | 11/1993 | Kojima | 257/316 |

FOREIGN PATENT DOCUMENTS 111370 6/1984 Japan .................. 357/23.5

*Primary Examiner*—Robert Limanek
*Attorney, Agent, or Firm*—Nixon & Vanderhye

[57] ABSTRACT

A non-volatile semiconductor memory including a semiconductor substrate, drain and source regions which are provided on the surface of the semiconductor substrate and have P or N type differently from the semiconductor substrate, a floating gate (first gate electrode) for covering a portion of a channel region between the drain and source regions, the drain region being self-aligned with the floating gate, the source region being provided apart from the floating gate through an offset region in the channel region by a constant distance, whereby the drain and source regions are asymmetrical to each other through the floating gate, a control gate (second gate electrode) for controlling the surface potential of the whole channel region, and a third gate electrode provided above the control gate through an insulating film for substantially controlling the surface potential on the underside of the floating gate and in the vicinity thereof so that electrical writing and erasure can be performed, wherein the density of the offset region on the semiconductor substrate surface is made different from that of other portions on the semiconductor substrate surface so that electrons can be injected from a source.

8 Claims, 8 Drawing Sheets

NON-VOLATILE SEMICONDUCTOR MEMORY WITH THIRD ELECTRODE COVERING CONTROL GATE

This is a continuation of application Ser. No. 07/723,216, filed Jun. 28, 1991, now abandoned.

BACKGROUND OF THE INVENTION

The present invention relates to a non-volatile semiconductor memory suitable for high integration and a method for manufacturing the same.

Referring to a conventional non-volatile semiconductor memory shown in FIG. 6, an N-type drain region 1a and an N-type source region 1b are provided on the surface of a P-type semiconductor substrate 1. A three-layer film 36 is provided apart from the source region 1b through a gate insulating film 2 by a constant distance. The three-layer film 36 includes a floating gate 3, a layer insulation film 33 and a control gate 34. A side wall electrode 35 is formed between the source region 1b and the three-layer film 36.

With the above-mentioned structure, the optimum potentials are applied on the side wall electrode 35 and the control gate 34, respectively. As a result, electrons can be injected from the source side to the floating gate 3.

Referring to the conventional non-volatile semiconductor memory, a side wall is formed between the source region 1b and the three-layer film 36 having the floating gate 3 on a self-control basis and is used as the electrode 35. Consequently, the whole manufacturing steps are very complicated.

SUMMARY OF THE INVENTION

It is an object of the present invention to provide a non-volatile semiconductor memory capable of performing electrical writing and erasure which can be manufactured more easily without side wall electrodes on an offset region in a channel region and with a small cell area, and a method for manufacturing the same.

The present invention provides a non-volatile semiconductor memory comprising a semiconductor substrate, drain and source regions which are provided on the surface of the semiconductor substrate and have P or N type differently from the semiconductor substrate, a floating gate (first gate electrode) for covering a portion of a channel region between the drain and source regions, the drain region being self-aligned with the floating gate, the source region being provided apart from the floating gate through an offset region in the channel region by a constant distance, whereby the drain and source regions are asymmetrical to each other with respect to the floating gate, a control gate (second gate electrode) for controlling the surface potential of the whole channel region, and a third gate electrode provided above the control gate through an insulating film for substantially controlling the surface potential on the underside of the floating gate and in the vicinity thereof so that electrical writing and erasure can be performed, wherein the density of the offset region on the semiconductor substrate surface is made different from that of other portions on the semiconductor substrate surface so that electrons can be injected from a source, or a non-volatile semiconductor memory comprising a semiconductor substrate, drain and source regions which are provided on the surface of the semiconductor substrate and have P or N type differently from the semiconductor substrate, a floating gate (first gate electrode) for covering a portion of a channel region between the drain and source regions, the drain region being self-aligned with the floating gate, the source region being provided apart from the floating gate through an offset region in the channel region by a constant distance, whereby the drain and source regions are asymmetrical to each other through the floating gate, and a control gate (second gate electrode) for controlling the surface potential of the whole channel region, wherein the density of the offset region on the semiconductor substrate surface is made different from that of other portions on the semiconductor substrate surface and the density of the offset region is substantially increased so that electrons can be injected from a source.

From another aspect, the present invention provides a method for manufacturing a non-volatile semiconductor memory comprising steps of implanting ions on the whole surface of a semiconductor substrate, on which a floating gate is provided through a gate insulating film, in an approximately perpendicular direction, implanting the ions in an oblique direction to the semiconductor substrate surface, forming a channel region which has an offset region and a semiconductor substrate surface region on the underside of the floating gate, forming a control gate through an insulating film on the whole surface of the semiconductor substrate having the floating gate, laminating an insulating film on the whole surface and flattening the same, and forming a third gate electrode which substantially controls the surface potential on the underside of the floating gate and in the vicinity thereof so that electrical writing and erasure can be performed, or a method for manufacturing a non-volatile semiconductor memory comprising steps of implanting ions on the whole surface of a semiconductor substrate, on which a floating gate is provided through a gate insulating film, in an approximately perpendicular direction, implanting the ions in an oblique direction to the semiconductor substrate surface, forming a channel region which has an offset region and a semiconductor substrate surface region on the underside of the floating gate, forming an insulating film on the whole surface of the semiconductor substrate which has the floating gate such that the floating gate is embedded therein and flattening the same, etching back the insulating film thus flattened so as to expose only the top of the floating gate, and forming a control gate through an insulating film which is newly formed on the whole surface of the semiconductor substrate having the floating gate.

DETAILED DESCRIPTION OF PREFERRED EMBODIMENTS

In a channel region formed between source and drain regions, the surface density of an offset region is made higher than the density of a semiconductor substrate surface region which is provided just below a floating gate, and/or the thickness of an insulating film, which is formed just above the offset region, is made higher. Consequently, the voltage characteristics to be applied to a control gate can be enhanced when injecting electrons (writing data) from the source region (when programming) (a voltage is set equal or greater than a threshold voltage Vth of the offset region). As a result, if the surface density of the offset region is increased, the coupling capacitance through the control gate can effectively cause the potential of the floating gate to be increased so as to obtain the potential necessary for injecting the electrons from the source region (about one and a half times to twice as much as a drain voltage). Consequently, a shortage, which is made smaller than a conventional one, of the floating gate potential necessary for injecting the electrons from the source region can be supplied by the coupling capacitance through the control gate from a third gate electrode. As a result, there can be obtained the cumulative floating gate potential necessary for injection. Thus, the electrons can easily be injected from the source region.

According to other embodiments of the present invention, the threshold voltage Vth of the offset region is increased to be equal to a control gate potential such that the floating gate potential necessary for injection can be obtained. Consequently, the electrons can be injected from a source without the third gate electrode.

Furthermore, the shortage of the floating gate potential increased by the coupling capacitance through the control gate can be supplied by direct coupling capacitance of the floating gate with the third gate electrode provided on the same surface as the floating gate. However, a cell size is increased.

Preferred embodiments of the present invention will be described in more detail with reference to the drawings.

Figure 1A:
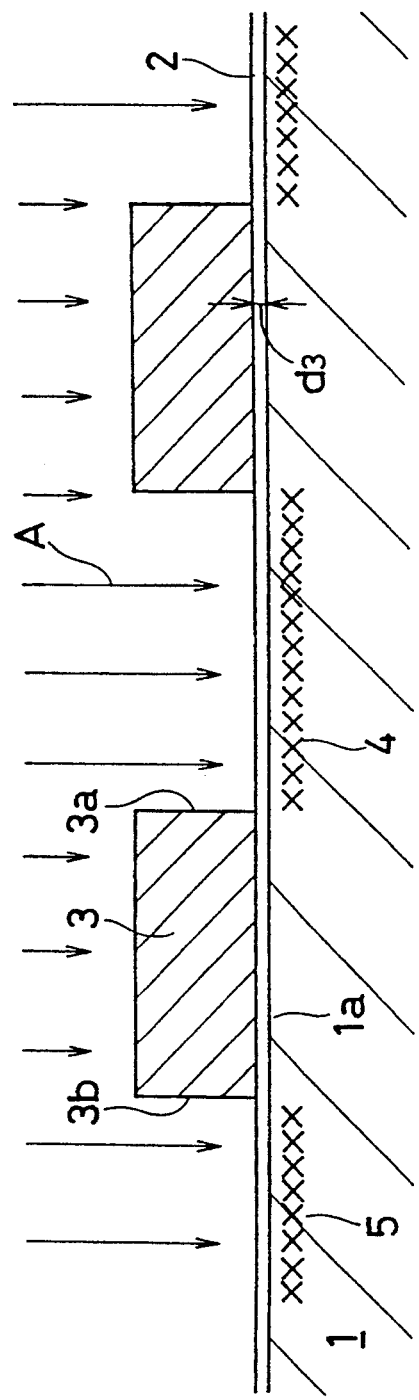
FIG. 1(a)-(f) includes cross-sectional views taken along section line I—I' of the semiconductor memory shown in FIG. 5 for explaining manufacturing steps according to a first embodiment of the present invention.
Figure 1B:
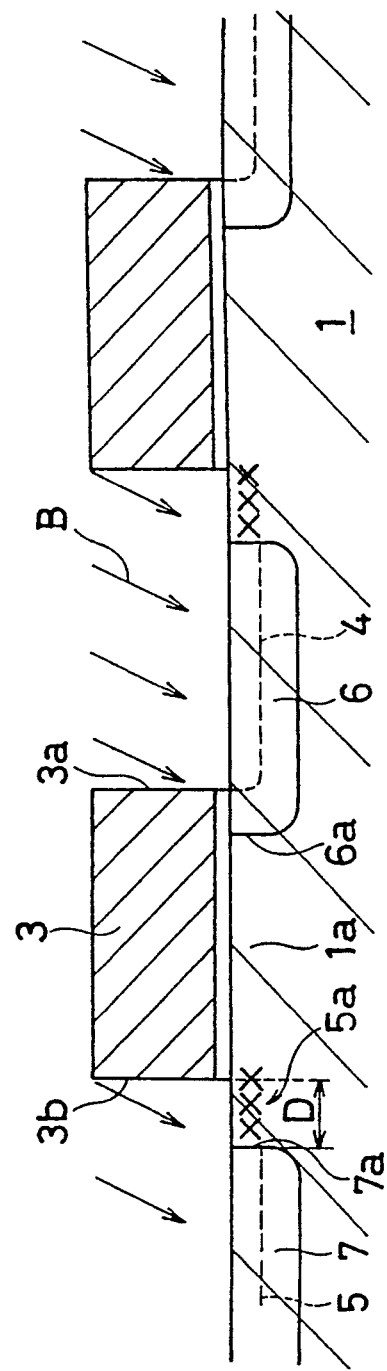
Figure 1C:
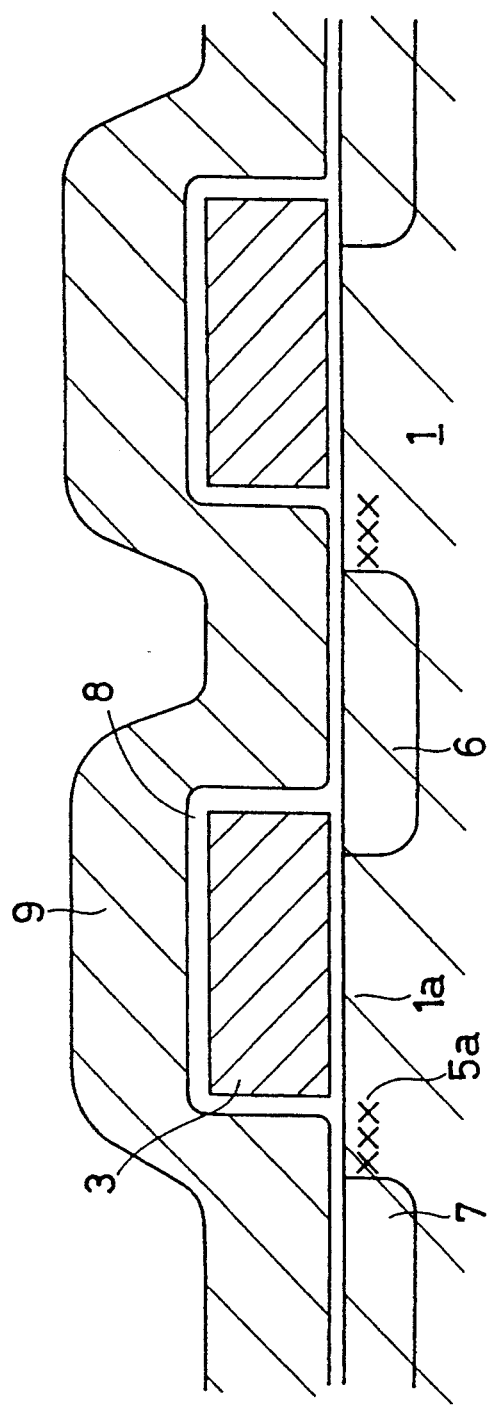
Figure 1D:
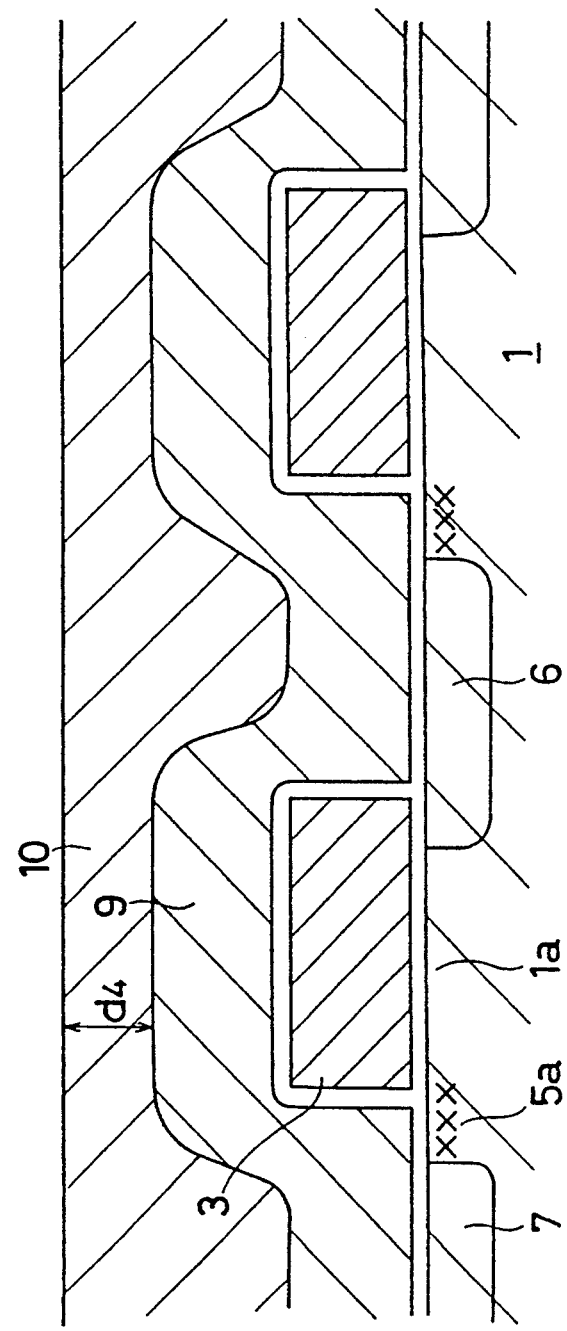
Figure 1E:
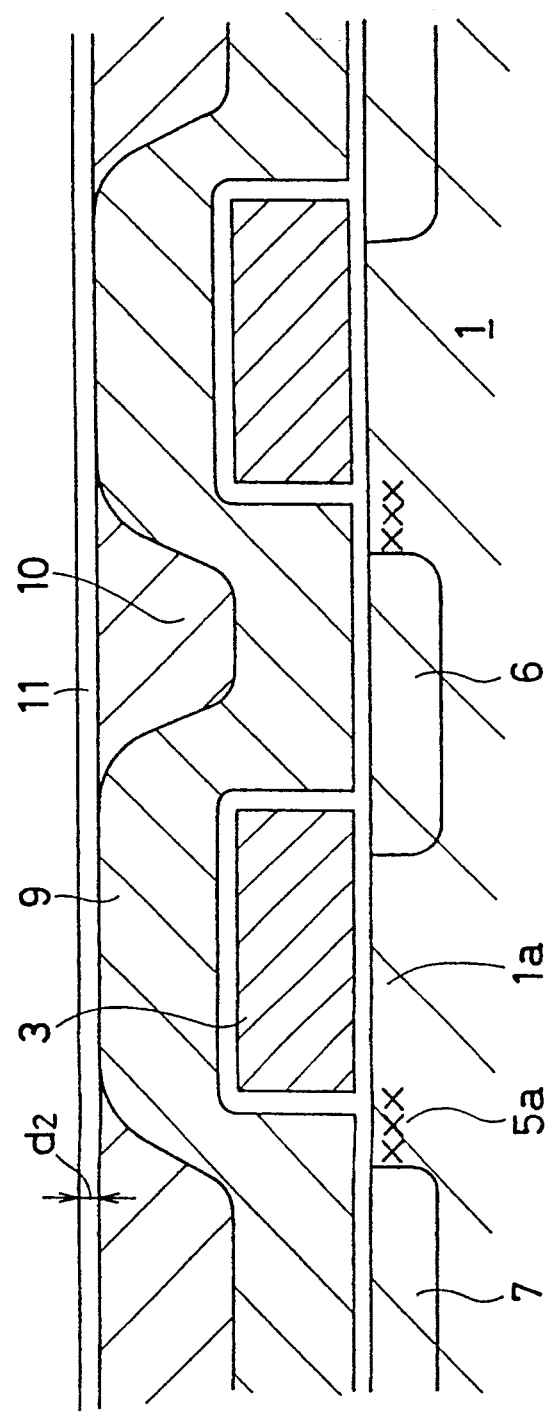
Figure 1F:
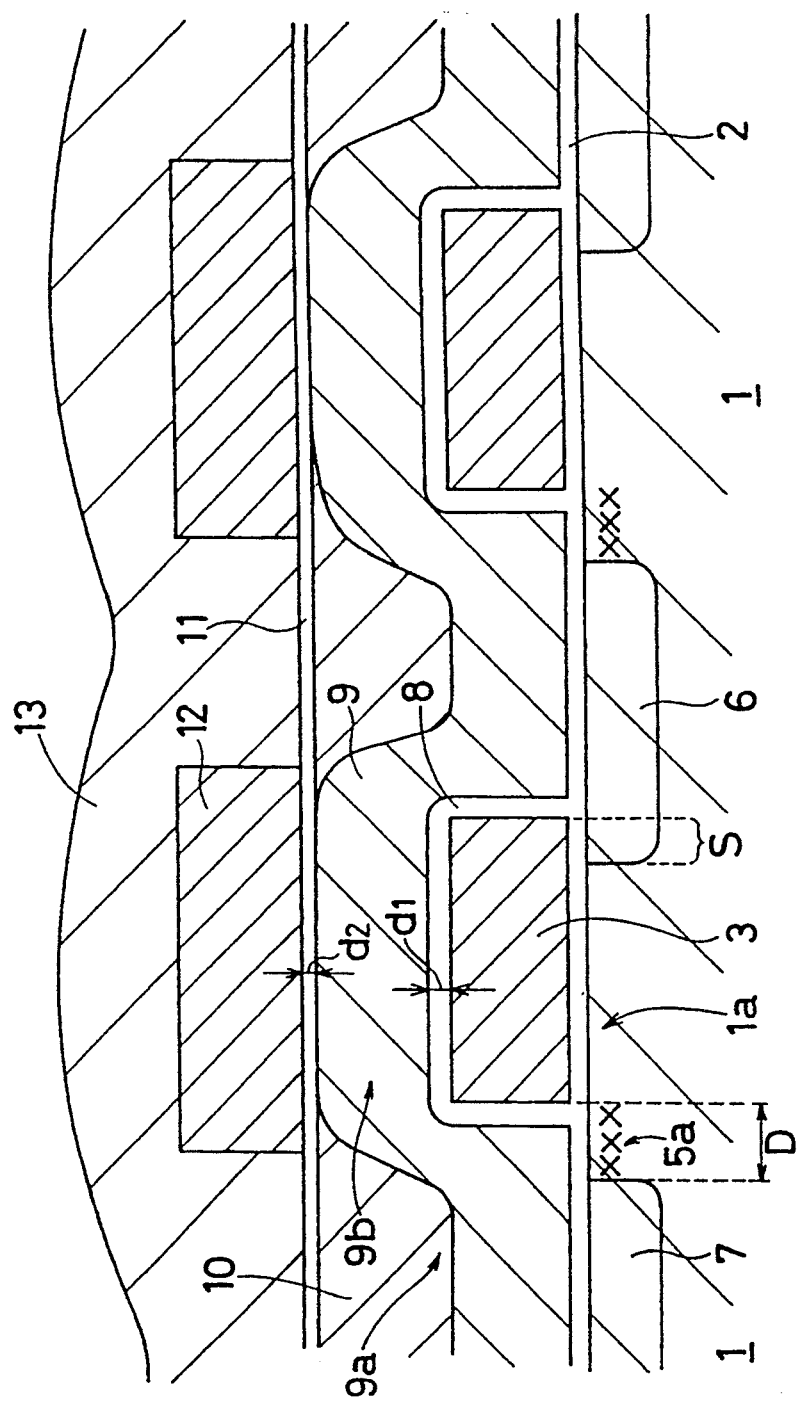
Figure 5:
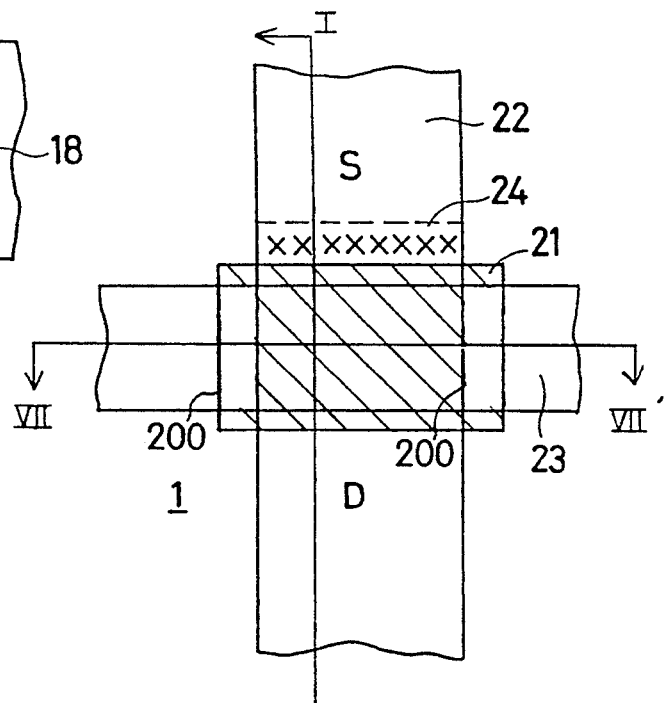
Figure 6:
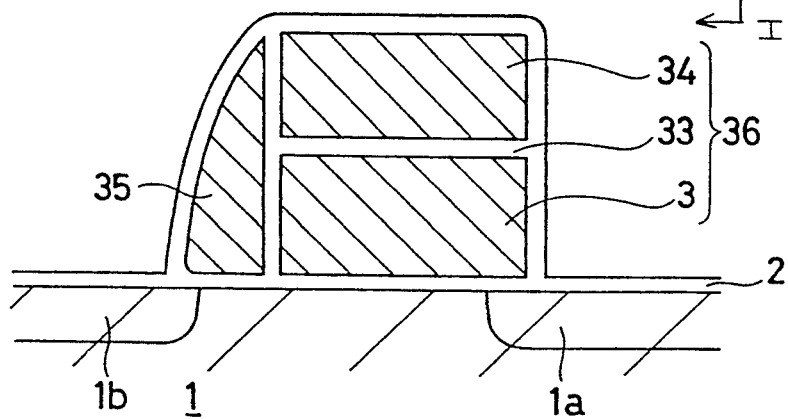
FIG. 6 is a diagram for explaining the structure of a main portion according to a prior art.

FIG. 1(f), which is a cross-sectional view of the semiconductor non-volatile memory along section line I—I' of FIG. 5, shows regions 6 and 7 on the surface of a P-type Si substrate 1. The drain region 6 overlaps with a floating gate (first gate electrode) 3 in an S region. The source region 7 is provided apart from the floating gate 3 through an offset region 5a by a constant distance D.

The offset region 5a between the source region 7 and the floating gate 3 is P-typed in similar to the substrate 1 and has a higher density than that of a substrate surface region 1a.

The floating gate 3 is provided on a gate insulating film 2 which covers the regions 6, 7, 1a and 5a. In addition, the floating gate 3 overlaps with the drain region 6 in the S region and is provided apart from the source region 7 through the offset region 5a. An insulating film (a first layer insulation film) 8 having a thickness d1 of 500 Å is laminated on the floating gate 3. The insulating film 8 covers the drain region 6, source region 7, offset region 5a and floating gate 3. A control gate (second gate electrode) 9 having irregularities is provided through the insulating film 8. Concave and convex portions 9a and 9b of the control gate 9, which are formed by covering the floating gate 3, are eliminated by a second layer insulation film 10 for flattening. Only the convex portion 9b comes into contact with a third gate electrode 12 through a thin insulating film (third layer insulation film) 11 having a thickness of 500 Å.

Indicated at 13 is a fourth layer insulation film which covers a lower electrode film (not shown).

The non-volatile semiconductor memory is manufactured as follows, keeping in mind FIGS. 1(a)-1(f) are sectional views along section I—I' of the memory shown in FIG. 5.

As shown in FIG. 1 (a), a gate insulating film 2 having a thickness d3 of 100 Å is formed on a P-type Si substrate 1. Then, a polysilicon layer is deposited on the whole surface to become P- or N-typed by doping. Thereafter, a floating gate 3 is formed in a predetermined region by patterning. To form a first P-type impurity region 4 having a higher density than that of the Si substrate 1 and a second P-type impurity region 5, boron ions as P-type impurities are implanted in an approximately perpendicular direction to the surface of the Si substrate 1 [in a direction of an arrow A shown in FIG. 1 (a)] by using the floating gate 3 as a mask.

In that case, an accelerating energy for implanting boron ions is preferably 35 to 60 KeV, more preferably 50 KeV. A quantity of ion implantation is preferably $2 \times 10^{12}$ to $6 \times 10^{12}$ cm$^{-2}$.

As a result, there are formed on the substrate the impurity regions 4 and 5, and a substrate surface portion 1a having a lower density than the impurity regions 4 and 5 (the density of the substrate in which the ions are not implanted).

To form N-type drain and source regions 6 and 7 which are reversely typed to the Si substrate 1 and have higher densities than the first and second impurity regions 4 and 5, N-type arsenic ions are implanted in an oblique direction to the surface of the Si substrate 1 [in a direction of an arrow B shown in FIG. 1 (b)] by using the floating gate 3 as the mask.

In that case, an accelerating energy for implanting arsenic ions is preferably 60 to 100 KeV, more preferably 80 KeV. A quantity of ion implantation is preferably $1 \times 10^{15}$ to $5 \times 10^{15}$ cm$^{-2}$, more preferably $2 \times 10^{15}$ cm$^{-2}$.

Thus, an end portion 6a of the drain region 6 enters a substrate surface portion 1a on one end portion 3a side of the floating gate 3. On the other hand, an end portion 7a of the source region 7 is provided apart from the substrate surface portion 1a on the other end portion 3b side of the floating gate 3 through an offset region 5a having a constant distance D. In this case, the drain region 6 includes the first impurity region 4 to have N-type, while the source region 7 includes most of the portions other than the offset region 5a in the second impurity region 5 to have N-type. Then, SiO$_2$, which is thermally oxidized or non-doped, is deposited to form an insulating film 8 around the floating gate 3 as shown in FIG. 1 (c). Thereafter, a second gate electrode (control gate) 9 is formed to cover the whole surface and is patterned.

To eliminate irregularities of the control gate 9 which are formed by covering the floating gate 3, an insulating film 10 having a thickness d4 of 5000 Å is formed on the whole surface of the control gate 9 for flattening [see FIG. 1 (d)]. Then, the whole surface is etched back to form the flat insulating film 10 as shown in FIG. 1 (e).

A newly thin insulating film 11 of high quality is formed at a thickness d2 of 200 Å over the whole surface of the insulating film 10. In this case, a preferred example of the insulating film 11 is an ONO film.

Then, a film to become an electrode is deposited and patterned to form a third electrode (third gate electrode) 12 [see FIG. 1 (f)]. The third electrode 12 comes into contact with only the convex portion 9b of the second gate electrode 9 through the thin insulating film 11 by coupling capacitance.

Thereafter, normal NOS manufacturing steps are started again. A SiO$_2$ film 13 containing phosphorus and boron is provided over the whole surface so as to form an electrode takeoff hole on each electrode portion, if necessary. Thus, manufacture is completed [see FIG. 1 (f)].

Figure 2:
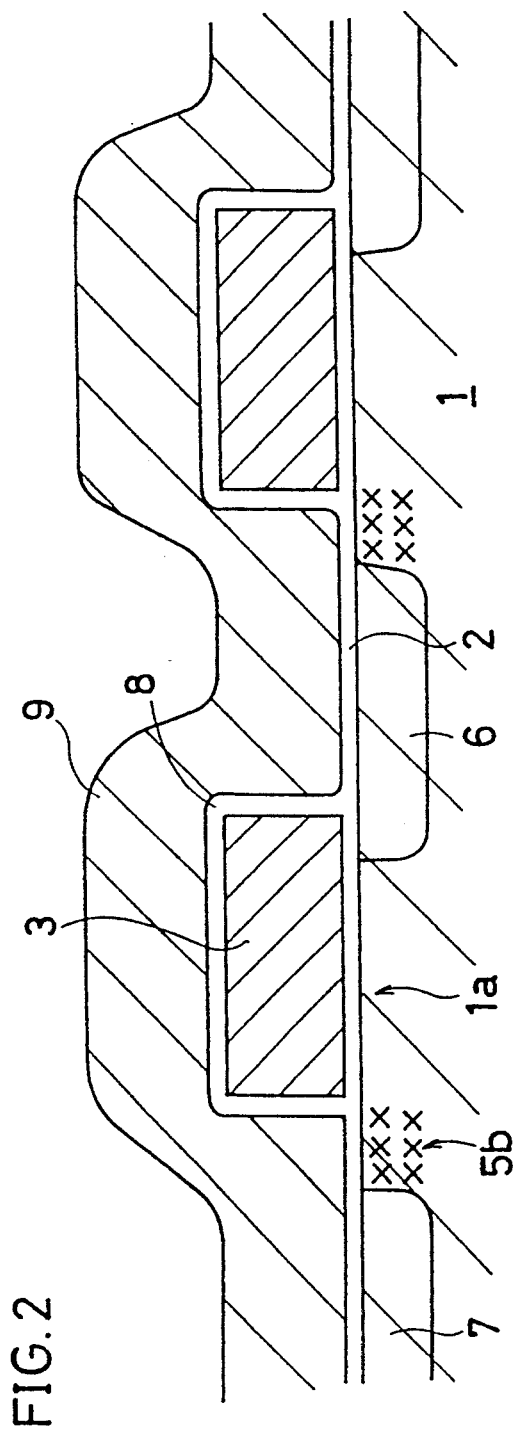
FIG. 2 is a diagram for explaining a structure according to a second embodiment of the present invention.

FIG. 2 shows a second embodiment of the present invention wherein the conditions of manufacture are changed such that electrons can be injected from a source to a floating gate without a third gate electrode.

As shown in FIG. 2, the density of an offset region 5b is made much higher than that of the offset region 5a in the first embodiment, so that Vth (threshold voltage) of the offset region in the channel region is equal to the potential of a second gate electrode for obtaining a floating gate potential necessary for injection. Consequently, a third gate electrode is not needed.

In that case, the P-type density of boron ions implanted in the offset region 5b is preferably $2\times 10^{13}$ to $6\times 10^{13}$ cm$^{-2}$.

Figure 3:
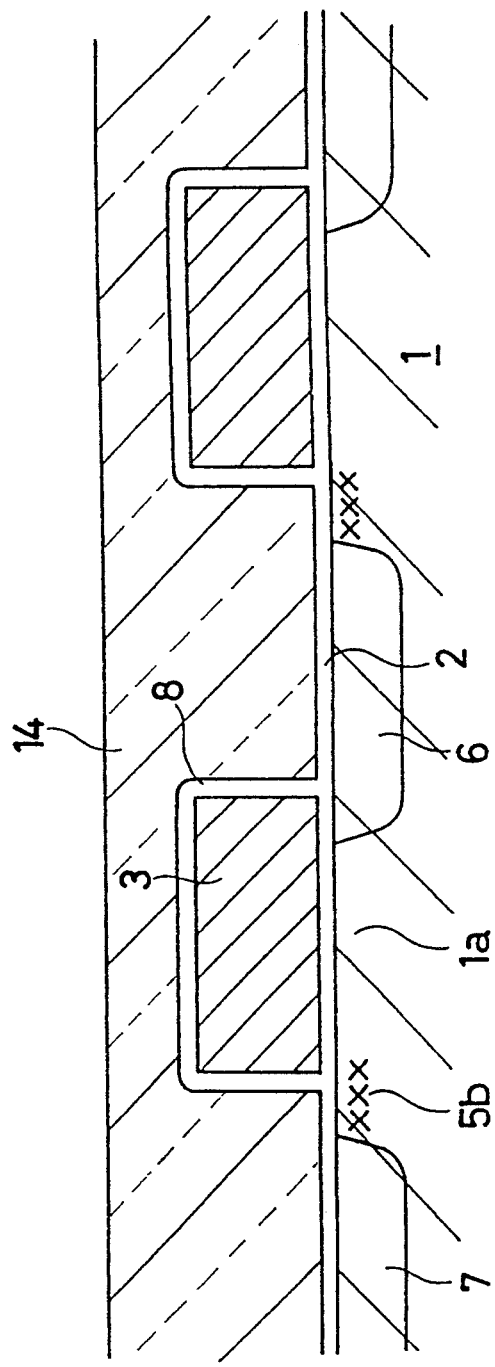
FIGS. 3(a)-3(c) is a diagram for explaining steps of manufacturing the same device as that of the second embodiment according to a third embodiment of the present invention.
Figure 3B:
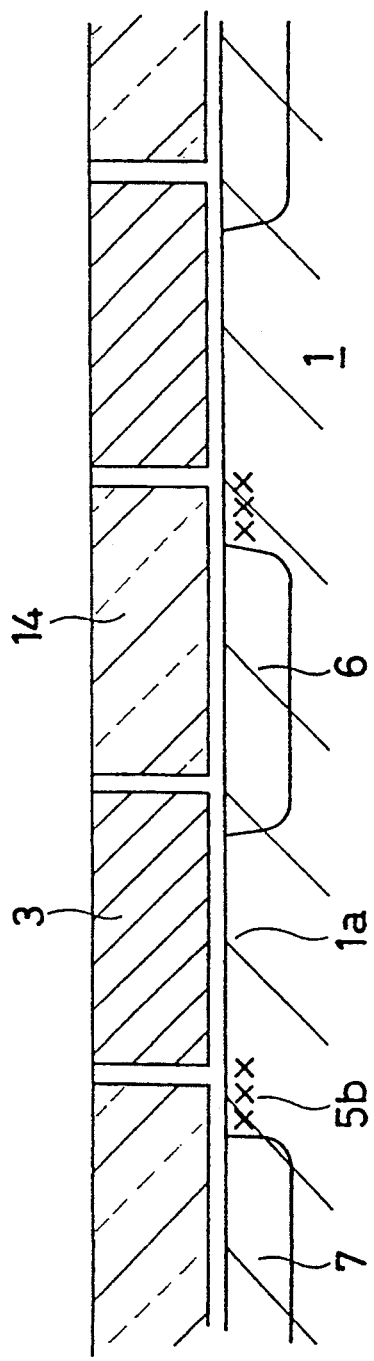
Figure 3C:
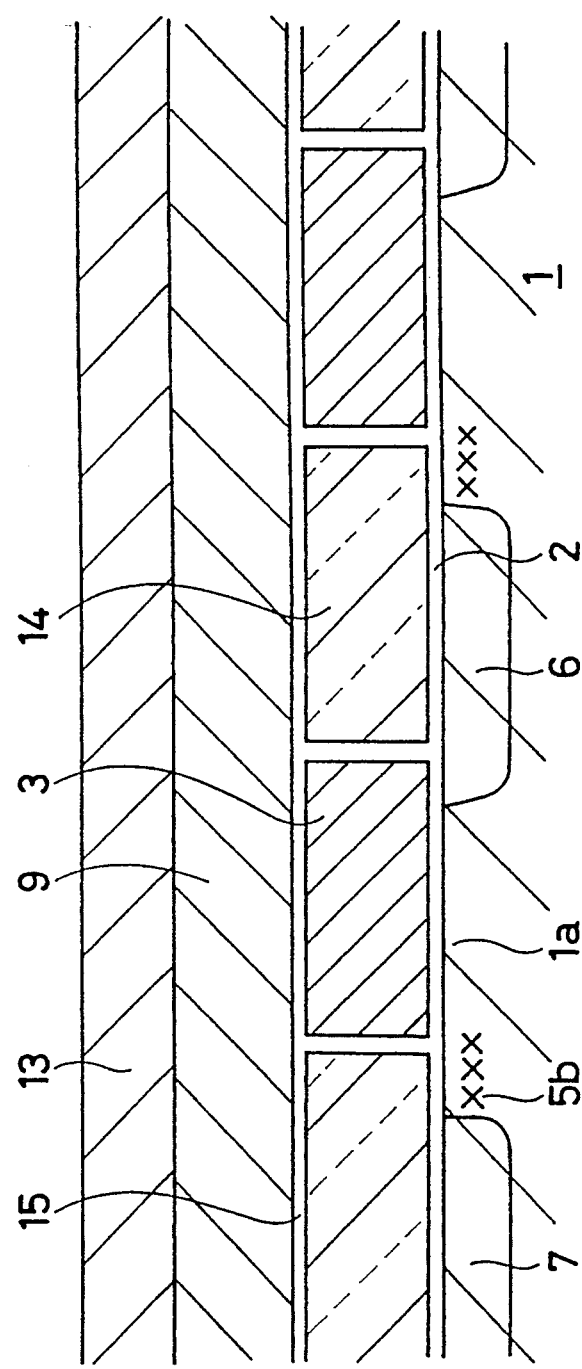

FIG. 3 shows a third embodiment of the present invention which is a variant of the second embodiment, and a manufacturing method. As shown in FIG. 3 (c), the density of an offset region 5b is made higher than that of the offset region 5a in the first embodiment, and the thickness of a gate film in the offset region 5b is increased. Thus, Vth of the offset portion 5b is set to be equal to a control gate voltage which gives a floating gate potential necessary for injecting electrons from a source region 7. Consequently, a third gate electrode is not needed. In this case, the P-type density of boron ions implanted in the offset region 5b is preferably $2\times 10^{13}$ to $6\times 10^{13}$ cm$^{-2}$.

There will be described the manufacturing method with reference to FIG. 3.

FIGS. 3 (a) and (b) show the same manufacturing steps as in the first embodiment. In the subsequent steps, an insulating film 14 for flattening is formed such that a floating gate 3 is embedded therein [see FIG. 3 (a)].

Then, etchback is carried out to expose only the top of the floating gate 3 [see FIG. 3 (b)]. Then, a newly thin insulating film of high quality (for example, an ONO film) 15 is formed. A second gate electrode 9 to become a control gate is laminated on the insulating film 15. The subsequent steps are the same as the normal MOS manufacturing steps.

There will be described the cases where a cell layout example is to be further simplified by means of the non-volatile semiconductor memory at the sacrifice of a cell area, i.e., the third gate electrode is provided on the same surface (see FIG. 4), and where the cell layout example is to be simplified by reducing the cell area, i.e., the third gate electrode is provided on an intersecting point of first and second gate electrodes (see FIG. 5).

Figure 4:
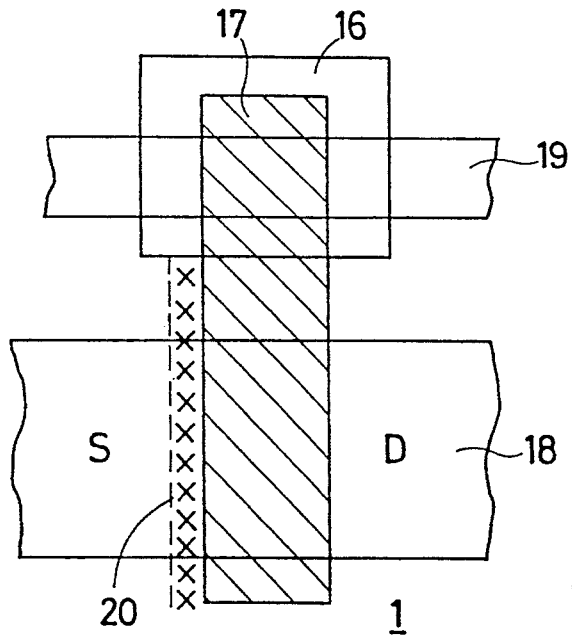
FIGS. 4 and 5 are diagrams for explaining the structure of main portions of different cell layout examples according to the present invention, respectively.

Referring to FIG. 4, a floating gate (first gate electrode) 17 is provided over a thin gate oxide film region and a thick oxide film (Field oxide film) region 16. A control gate (second gate electrode) 18 is capacitively-coupled with the floating gate in the thin gate oxide film region. A third gate electrode 19 is directly coupled with the floating gate in the thick oxide film region on the same surface. A P-type impurity region is indicated at 20.

In that case, the floating gate potential necessary for injecting electrons from a source is comprised of the potential applied from the control gate 18 and the potential applied from the third gate electrode 19 which is directly capacitively-coupled with the floating gate 17.

Referring to FIG. 5, a third gate electrode 23 is capacitively-coupled in an overlapping portion of a floating gate (first gate electrode) 21 and a control gate (second gate electrode) 22 in order to reduce the cell area as described above with reference to FIG. 1. In this case, the floating gate potential necessary for injecting the electrons from the source is comprised of the potential applied from the control gate 22 and the potential applied from the third gate electrode 23 which is indirectly capacitively-coupled with the floating gate 21 through the control gate.

Figure 7:
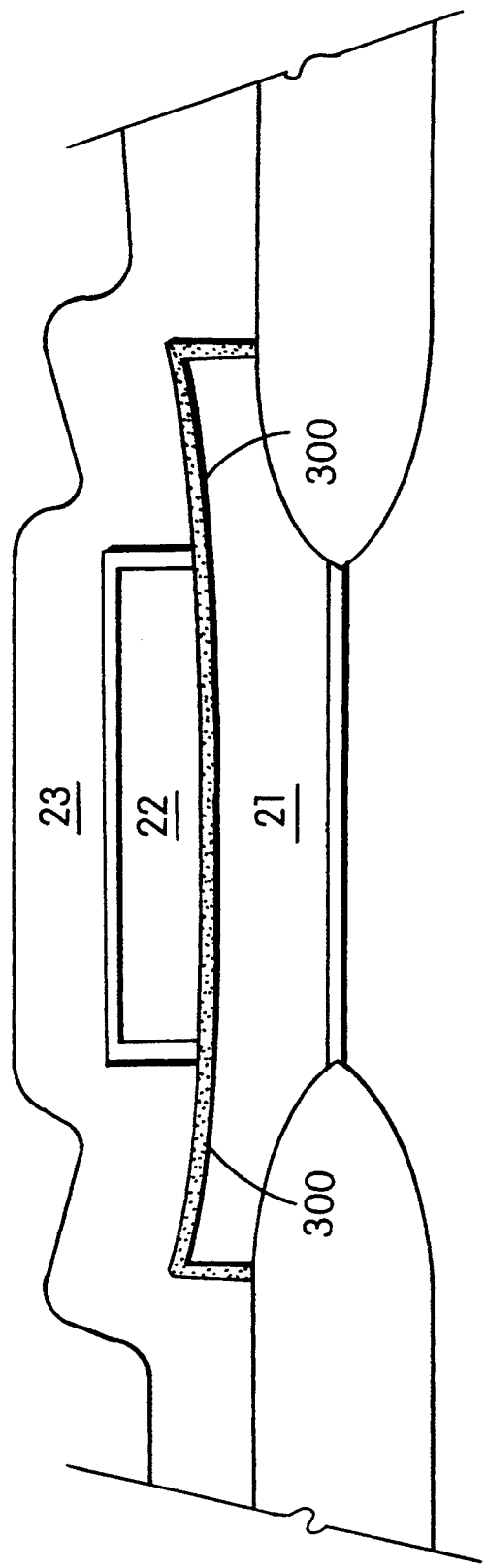
FIG. 7 is a cross-sectional view of the semiconductor memory shown in FIG. 5 along section line VII—VII' according to the present invention.

FIG. 7 shows a cross-sectional view of the semiconductor memory shown in FIG. 5 along section line VII—VII'. As shown in FIG. 5, third gate 23 and floating ate 21 partially overlap at regions 200 (shaded black for clarity). FIG. 7 illustrates that in the overlapping regions where the insulation regions 300 are shaded black, capacitive-coupling occurs between floating gate 21 and a third gate 23.

With the above-mentioned structure, (i) the length and impurity density of the offset region can easily be self-controlled, (ii) the shortage of the potential applied from the control gate out of the floating gate potential necessary for injecting the electrons from the source is supplied by the third electrode which is directly or indirectly capacitively-coupled with the floating gate, so that writing can be stabilized, (iii) the cell area can be reduced by making the third electrode overlap with the top of the first and second gate electrodes as shown in FIG. 1, and (iv) if process is devised as described above, the electrons can be injected from the source without the third gate electrode.

As described above, there can be obtained effects that the length and density of the offset region can be self-controlled in a manner similar to that described in the background of the specification, and source programming can be carried out by means of only the control gate by changing the density of the semiconductor substrate on the underside of the floating gate in the channel region and in other regions without side wall electrodes, making the third electrode, which can be manufactured more easily, overlap in a three-dimensional basis.

What is claimed is:

1. A non-volatile semiconductor memory comprising: a semiconductor substrate;

drain and source regions provided in the substrate surface having a conductivity type different from that of the substrate;

a first floating gate electrode covering a portion of a channel region formed between the drain and source regions, wherein the drain region is a self-aligned with the first floating gate electrode and the source region is offset from the first floating gate electrode through an offset region in the channel region having a different doping density from the doping density of the substrate to permit electron injection from the source region to the first floating gate electrode;

a second control gate electrode provided over and insulated from the first floating gate electrode and the offset region for controlling a surface potential of the offset region and the channel region beneath the first floating gate electrode; and a third gate electrode provided over and insulated from the second control gate electrode and partially overlapping and capacitively coupled to a substantial portion of the first floating gate electrode including portions of the first floating gate electrode that are not covered with the second control gate electrode for enhancing the potential of the first floating gate electrode to permit selective storage and erasure of electrical charge.

2. The memory according to claim 1, wherein the doping density of the offset region is higher than that of the substrate and the channel region beneath the floating gate electrode.

3. The memory according to claim 1, wherein the third gate electrode enhances the first floating gate electrode potential via capacitive coupling through the partial overlap of the first floating gate electrode and the third gate electrode.

4. A non-volatile semiconductor memory comprising:
a semiconductor substrate;
drain and source regions provided in the substrate surface having a conductivity type different from that of the substrate;
a floating gate electrode covering a portion of a channel region formed between the drain and source regions, wherein the drain region is self-aligned with the floating gate electrode and the source region is offset from the floating gate electrode through an offset region in the channel region, and
a control gate electrode provided over and insulated from the floating gate electrode and the offset region by a first insulation film for controlling a surface potential of the offset region and the channel region beneath the floating gate electrode,
wherein a second insulation film having a thickness substantially the same as the floating gate is provided over the offset region on top of the first insulation film to permit electron injection from the source region to the floating gate electrode.

5. The memory according to claim 4, wherein the doping density of the offset region is higher than that of the substrate and the channel region beneath the floating gate electrode.

6. The memory according to claim 4, wherein the control gate enhances the substrate surface potential of the offset region.

7. The memory according to claim 14, wherein a threshold voltage of the offset region is equal to a control gate voltage thereby enhancing a floating gate potential to permit the electron injection.

8. A non-volatile semiconductor memory comprising:
a semiconductor substrate;
drain and source regions provided in the substrate surface having a conductivity type different from that of the substrate;
a first floating gate electrode covering a portion of a channel region formed between the drain and source regions, wherein the drain region is self-aligned with the first floating gate electrode and the source region is offset from the first floating gate electrode through an offset region in the channel region having a different doping density from the doping density of the substrate to permit electron injection from the source region to the first floating gate electrode;
a second control gate electrode provided over the channel region and insulated from the first floating gate electrode and the offset region for controlling a surface potential of the offset region and the channel region beneath the first floating gate electrode; and
a third gate electrode provided over and insulated from the first floating gate electrode in regions except the channel region for enhancing the potential of the first floating gate electrode to permit selective storage and erasure of electrical charge.

* * * * *